(12) United States Patent
Hill et al.

(10) Patent No.: US 10,318,150 B2
(45) Date of Patent: Jun. 11, 2019

(54) SEGMENT LENGTH MEASUREMENT USING A TOUCH SCREEN SYSTEM IN RESPONSE TO GESTURE INPUT

(71) Applicant: Texas Instruments Incorporated, Dallas, TX (US)

(72) Inventors: Joe Dean Hill, Wylie, TX (US); Michel Georges Stella, Dallas, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 15/606,527

(22) Filed: May 26, 2017

(65) Prior Publication Data

US 2017/0262170 A1 Sep. 14, 2017

Related U.S. Application Data

(63) Continuation of application No. 14/638,735, filed on Mar. 4, 2015, now Pat. No. 9,690,478.

(60) Provisional application No. 61/947,747, filed on Mar. 4, 2014.

(51) Int. Cl.
| | | |
|---|---|---|
| *G06F 3/041* | (2006.01) | |
| *G06F 3/0488* | (2013.01) | |
| *G06F 3/01* | (2006.01) | |
| *G06F 3/0484* | (2013.01) | |
| *G06T 11/20* | (2006.01) | |
| *G06F 17/50* | (2006.01) | |

(52) U.S. Cl.
CPC .......... *G06F 3/04883* (2013.01); *G06F 3/017* (2013.01); *G06F 3/0488* (2013.01); *G06F 3/04842* (2013.01); *G06F 3/041* (2013.01); *G06F 3/0412* (2013.01); *G06F 17/50* (2013.01); *G06F 2203/04101* (2013.01); *G06T 11/203* (2013.01)

(58) Field of Classification Search
CPC ........ G06F 3/017; G06F 3/041; G06F 3/0412; G06F 3/0488; G06F 3/04883; G06F 17/50; G06F 2203/04101; G06T 11/203
See application file for complete search history.

(56) References Cited

U.S. PATENT DOCUMENTS

| | | |
|---|---|---|
| 5,861,874 A | 1/1999 | Joto |
| 8,686,943 B1 | 4/2014 | Rafii |
| 9,235,310 B2 | 1/2016 | Iwasaki et al. |

(Continued)

*Primary Examiner* — Michael J Eurice
(74) *Attorney, Agent, or Firm* — Rose Alyssa Keagy; Charles A. Brill; Frank D. Cimino

(57) ABSTRACT

Disclosed embodiments relate to processing of gestures to cause computation of measurements of a line using a touch screen. A system includes a processor, a touch screen coupled to the processor, a gesture module coupled to the processor for executing a gesturing method. The method includes determining a gesture shape and whether the gesture shape selects a first line segment by intersecting the first line segment. When the gesture shape selects a first line segment, it is then determined whether the gesture shape also selects an additional line segment different from the first line segment. When an additional line segment is not selected, the method calculates the length measurement from the beginning point of the segment to the end point of the selected first line segment. The method further displays the length measurement on a display.

18 Claims, 2 Drawing Sheets

(56) References Cited

U.S. PATENT DOCUMENTS

| | | | |
|---|---|---|---|
| 2002/0113784 A1* | 8/2002 | Feilmeier | G06F 1/1626 345/419 |
| 2003/0030642 A1* | 2/2003 | Chen | G06T 15/005 345/519 |
| 2003/0043214 A1* | 3/2003 | Thompson | G06F 3/04842 715/863 |
| 2006/0025218 A1* | 2/2006 | Hotta | A63F 13/06 463/37 |
| 2006/0125803 A1 | 6/2006 | Westerman et al. | |
| 2008/0228061 A1* | 9/2008 | Habets | G06T 7/62 600/407 |
| 2009/0189877 A1 | 7/2009 | Washino et al. | |
| 2009/0322701 A1 | 12/2009 | D'Souza et al. | |
| 2010/0309115 A1* | 12/2010 | Sabanai | G06F 3/04845 345/156 |
| 2011/0157083 A1 | 6/2011 | Hershman et al. | |
| 2012/0200604 A1 | 8/2012 | Imaeda et al. | |
| 2012/0216141 A1* | 8/2012 | Li | G06F 3/04883 715/780 |
| 2012/0322527 A1* | 12/2012 | Aoki | G07F 17/3206 463/16 |
| 2013/0271430 A1 | 10/2013 | Nakamura | |
| 2014/0002414 A1* | 1/2014 | Iwasaki | G06F 3/045 345/174 |
| 2014/0232859 A1 | 8/2014 | Kotzur et al. | |
| 2014/0340335 A1 | 11/2014 | Fleischmann et al. | |
| 2015/0106769 A1 | 4/2015 | Yamazaki et al. | |
| 2015/0145784 A1* | 5/2015 | Dowd | G06F 3/04883 345/173 |
| 2016/0054887 A1* | 2/2016 | Tumwattana | G06F 3/0488 715/810 |
| 2016/0109960 A1 | 4/2016 | Steinle et al. | |
| 2016/0196042 A1* | 7/2016 | Laute | G06F 3/017 715/845 |
| 2016/0357430 A1* | 12/2016 | Migos | G06F 3/04845 |

\* cited by examiner

∠ CAB ≡ 56.4° d(DE) = 7.17 cm

SEGMENT LENGTH MEASUREMENT USING A TOUCH SCREEN SYSTEM IN RESPONSE TO GESTURE INPUT

CROSS REFERENCE TO RELATED APPLICATIONS

The present application is a continuation of and claims priority to U.S. patent application Ser. No. 14/638,735 entitled "METHOD AND SYSTEM FOR PROCESSING GESTURES TO CAUSE COMPUTATION OF MEASUREMENT OF AN ANGLE OR A SEGMENT USING A TOUCH SYSTEM," filed on Mar. 4, 2015, which claims priority to U.S. Provisional Patent Application No. 61/947,747 entitled "GESTURE TO CAUSE COMPUTATION OF ANGLE MEASUREMENT IN A TOUCH SYSTEM," filed on Mar. 4, 2014, all of which are hereby incorporated by reference in their entireties.

BACKGROUND

Technical Field

Embodiments of the present invention generally relate to a method and system for processing gestures to cause computation of measurements of an angle or a segment using a touch system.

Description of the Related Art

In a touch system, measuring segments and angles is cumbersome. Angles are generally defined by three (3) points. Calculating the measurement of an angle generally involves multiple steps—accessing the menu, choosing a measurement tool, and then touching the three points defining the angle.

Therefore, there is a need for a method and/or apparatus for processing gestures to cause computation of measurements of an angle or a line using a touch system.

SUMMARY

Embodiments of the present invention relate to a method and a system for processing gestures to cause computation of measurements of a line segment using a touch screen. The system includes a processor, a touch screen coupled to the processor, a gesture module coupled to the processor for executing a gesturing method. The method includes determining a gesture shape and whether the gesture shape selects a first line segment by intersecting the first line segment. When the gesture shape selects a first line segment, it is then determined whether the gesture shape also selects an additional line segment different from the first line segment. When an additional line segment is not selected, the method calculates the length measurement from the beginning point of the segment to the end point of the selected first line segment. The method further displays the length measurement on a display.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
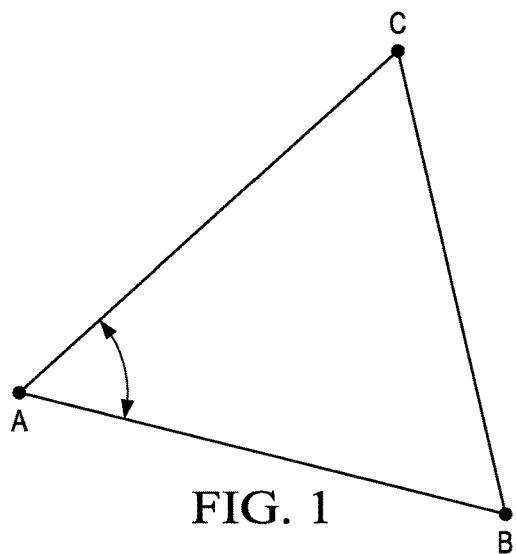
FIG. 1 is an embodiment of a diagram depicting a gesture for triggering calculating an angle using a touch screen.

Utilizing a touch screen, the user slides fingers, a pointer or the likes from one line to another. In some embodiments, a touch screen is a screen that is capable of recognizing a gesture without necessarily requiring an actual (e.g., physical) touch of the screen, such as, a gesture of hand, finger, stylus, motion, etc. In other embodiments, a touch screen is a screen that recognizes a gesture from actually touching the screen. FIG. 1 is an embodiment of a diagram depicting a gesture for triggering calculating a measurement of an angle using a touch screen. In FIG. 1, an embodiment of an arc or a line drawn from one line of the angle to the other is depicted. As shown in FIG. 1, the user gestures an arc or a line from line AC to line AB or from AB to line AC to calculate angle CAB or BAC. While lines AC and AB are shown as touching (e.g., meeting at point A) in the depicted embodiment, it is understood that in other embodiments, such lines forming an angle need not necessarily touch.

Figure 2:
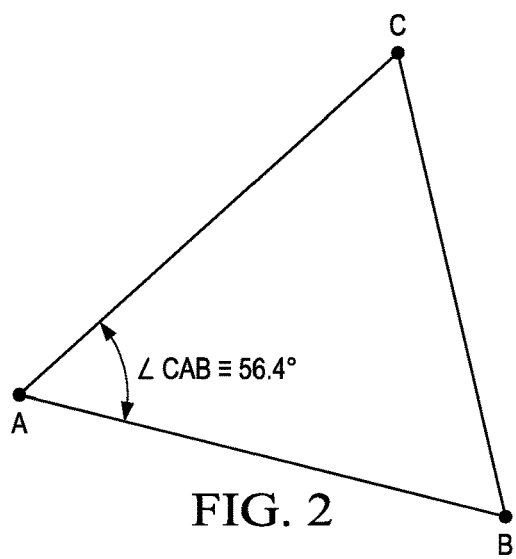
FIG. 2 is an embodiment of a diagram depicting a calculation of the angle of FIG. 1.

FIG. 2 is an embodiment of a diagram depicting a calculation of the angle of FIG. 1. As shown in FIG. 2, a method or system coupled to the touch screen recognizes the gesture and computes the angle's measurement, which is shown in FIG. 2 to be 56.4°.

Figure 3:
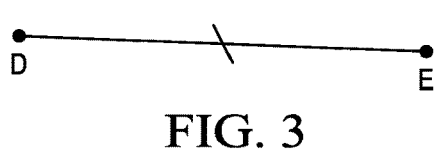
FIG. 3 is an embodiment of a diagram depicting a gesture for triggering calculating a segment using a touch screen.

In accordance with a further aspect of the present disclosure, a user utilizing a touch screen provides a gesture by sliding a finger, a pointer or the like across a segment. FIG. 3 is an embodiment of a diagram depicting a gesture for triggering calculating measurement of a segment's length using a touch screen. In FIG. 3, an embodiment of a line drawn across a segment is depicted. As shown in FIG. 3, the user gestures a line crossing segment DE to calculate the measurement of segment DE.

Figure 4:
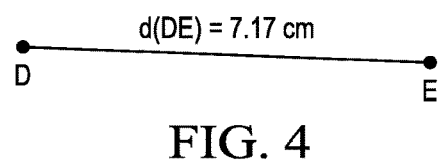
FIG. 4 is an embodiment of a diagram depicting a calculation of the segment of FIG. 3.

FIG. 4 is an embodiment of a diagram depicting a calculation of the segment of FIG. 3. As shown in FIG. 4, a method or system coupled to the touch screen recognizes the gesture and computes the measurement of the segment from the segment's beginning point to its end point, which is shown in FIG. 4 to be 7.17 cm.

Figure 5:
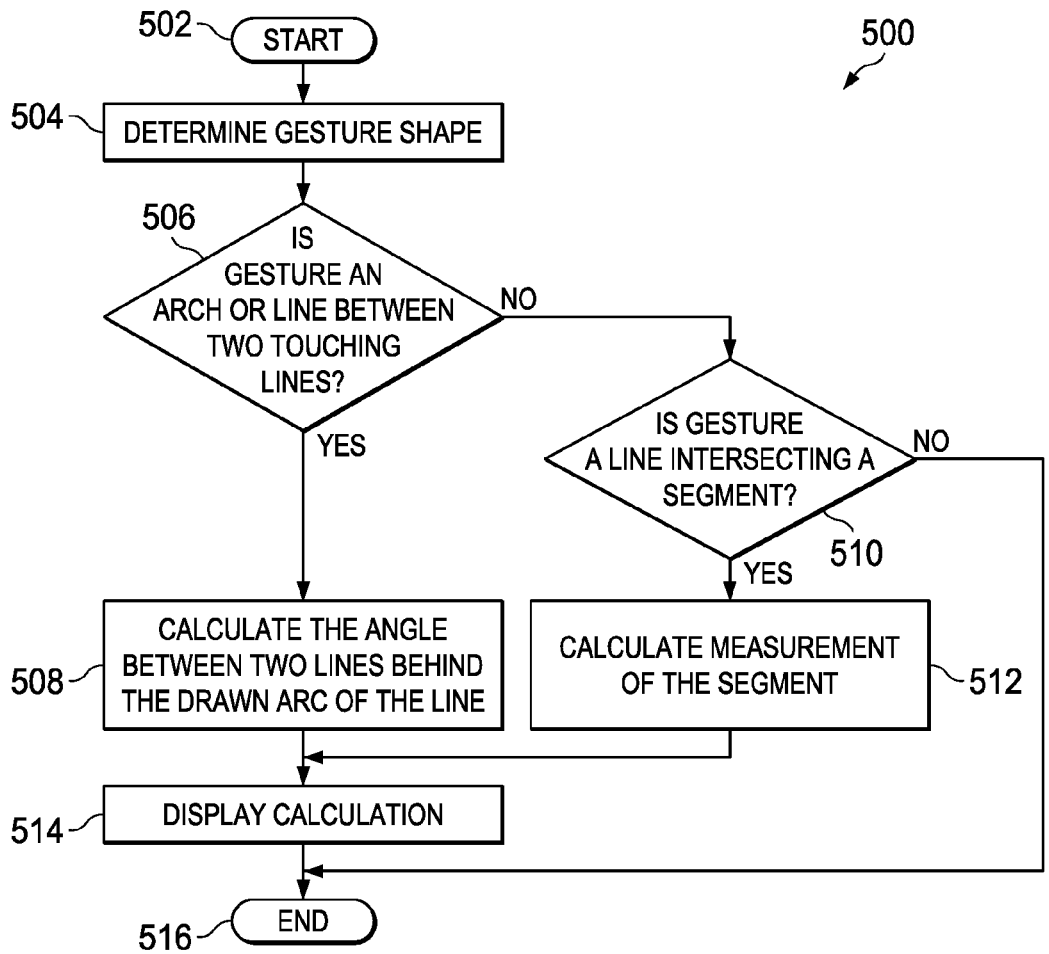
FIG. 5 is an embodiment of a flow diagram of a gesturing method for processing gestures to cause computation of measurements of an angle or a segment using a touch system.

FIG. 5 is an embodiment of a flow diagram of a gesturing method 500 for processing gestures to cause computation of measurements of an angle or a segment using a touch system. The method starts at step 502 and proceeds to step 504, wherein the method 500 determines the shape of the gesture. At step 506, the method 500 determines if the gestured shape is an arc or line between two touching lines. As stated above, in some embodiments, the two lines need not necessarily be touching. If a gestured arc or line is between two such lines, then the method 500 proceeds to step 508, wherein the angle between the lines and behind the arc or line is calculated. Otherwise, the method 500 proceeds to step 510.

At step 510, the method 500 determines if the gestured shape is a line that intersects a segment (e.g., one line as opposed to two lines). If it is, then the method 500 proceeds to step 512, wherein the measurement between the beginning point and the end point of the segment is calculated. Otherwise, the method 500 proceeds to step 516. From steps 508 and 512, the method 500 proceeds to step 514, wherein the calculated measurements are displayed and the method 500 proceeds to step 516. The method 500 ends at step 516.

Figure 6:
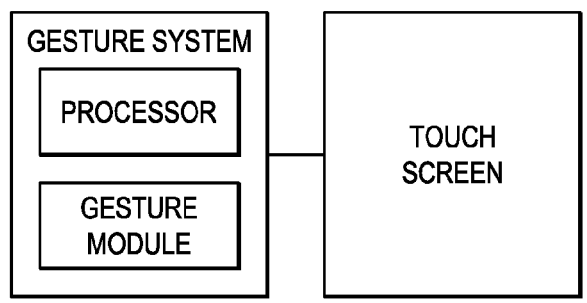
FIG. 6 is an embodiment of a system diagram utilizing the method of FIG. 5.

FIG. 6 is an embodiment of a gesture system diagram that performs or otherwise utilizes the method of FIG. 5. The gesture system comprises a processor, a gesture module and a touch screen. The processor is capable of executing instructions to perform functions, such as, calculating measurements, determining gestures from a touch screen, and the like. The gesture module performs a method such as the method 500 of FIG. 5. The touch screen is coupled to the processor directly, indirectly or wirelessly to facilitate gesture recognition and/or determination by the gesture system.

While the foregoing is directed to embodiments of the present invention, other and further embodiments of the invention may be devised without departing from the basic scope thereof, and the scope thereof is determined by the claims that follow.

What is claimed is:

1. A system comprising:
a touch screen display for displaying at least one line segment and having a touch screen for receiving a gesture input;
a processor communicatively coupled to the touch screen; and
a memory communicatively coupled to the processor and storing program instructions that, when executed by the processor, cause the processor to:
determine a gesture shape indicated by the gesture input;
determine whether the gesture input selects a first line segment displayed on the touch screen display, wherein selection of the first line segment is indicated by the gesture shape intersecting the first line segment;
when the gesture input selects the first line segment, determine whether the gesture input selects a second line segment displayed on the touch screen display, wherein selection of the second line segment is indicated by the gesture shape intersecting the second line segment; and
when the gesture input does not select a second line segment, determine a beginning point and an end point of the selected first line segment, determine a length measurement between the beginning point and the end point, and display the determined length measurement on the touch screen display.

2. The system as claimed in claim 1, wherein the gesture shape is an arc.

3. The system as claimed in claim 1, wherein the gesture shape is a line.

4. The system as claimed in claim 1, wherein the determined length measurement is displayed on the touch screen display in close proximity to the selected first line segment.

5. The system as claimed in claim 1, wherein the program instructions, when executed by the processor, further cause the processor to:
when the gesture input does select a second line segment displayed on the touch screen display, identify an angle formed between the selected first line segment and the selected second line segment, determine an angle measurement of the angle, and display the determined angle measurement on the touch screen display.

6. The system as claimed in claim 5, wherein the determined angle measurement is displayed on the touch screen display in close proximity to the angle.

7. A method for initiating a measurement calculation of a line segment displayed on a touch screen display of a processor-based system, the method comprising:
using the touch screen display to receive a gesture input;
using a processor of the processor-based system to determine a gesture shape indicated by the gesture input;
using the processor to determine whether the gesture input selects the line segment, wherein selection of the line segment is indicated by the gesture shape intersecting the line segment;
when the line segment is selected by the gesture shape, using the processor to determine whether the gesture input selects at least one other line segment displayed on the touch screen display, wherein selection of the at least one other line segment is indicated by the gesture shape also intersecting the at least one other line segment; and
when the gesture input does not select at least one other line segment displayed on the touch screen display, using the processor to identify a beginning point and an end point of the selected line segment, determine a length measurement between the beginning point and the end point, and display the determined length measurement on the touch screen display.

8. The method as claimed in claim 7, wherein the gesture shape is an arc.

9. The method as claimed in claim 7, wherein the gesture shape is line.

10. The method as claimed in claim 7, wherein the determined length measurement is displayed on the touch screen display in close proximity to the selected line segment.

11. The method as claimed in claim 7, comprising, when the gesture input selects one other line segment displayed on the touch screen display, using the processor to identify an angle formed between the selected line segment and the selected one other line segment, determine an angle measurement of the angle, and display the determined angle measurement on the touch screen display.

12. The method as claimed in claim 11, wherein the determined angle measurement is displayed on the touch screen display in close proximity to the angle.

13. A non-transitory computer-readable medium comprising instructions, that when executed by a processor, cause the processor to:
determine a gesture shape indicated by a gesture input received by a touch screen display;
determine whether the gesture input selects a first line segment displayed on the touch screen display, wherein selection of the first line segment is indicated by the gesture shape intersecting the first line segment;
when the gesture input selects the first line segment, determine whether the gesture input selects a second line segment displayed on the touch screen display, wherein selection of the second line segment is indicated by the gesture shape intersecting the second line segment; and
when the gesture input does not select a second line segment, determine a beginning point and an end point of the selected first line segment, determine a length measurement between the beginning point and the end point, and display the determined length measurement on the touch screen display.

14. The non-transitory computer-readable medium as claimed in claim 13, wherein the gesture shape is an arc.

15. The non-transitory computer-readable medium as claimed in claim 13, wherein the gesture shape is a line.

16. The non-transitory computer-readable medium as claimed in claim 13, wherein the instructions cause the processor to display the determined length measurement on the touch screen display in close proximity to the selected first line segment.

17. The non-transitory computer-readable medium as claimed in claim 13, wherein the instructions, when executed by the processor, further cause the processor to:

when the gesture input does select a second line segment displayed on the touch screen display, identify an angle formed between the selected first line segment and the selected second line segment, determine an angle measurement of the angle, and display the determined angle measurement on the touch screen display.

18. The non-transitory computer-readable medium as claimed in claim 17, wherein the instructions cause the processor to display the determined angle measurement on the touch screen display in close proximity to the angle.

* * * * *